United States Patent
Pavlovic et al.

(10) Patent No.: US 12,283,962 B2
(45) Date of Patent: Apr. 22, 2025

(54) METHOD OF CONTROLLING A FREQUENCY-MODULATED OSCILLATOR OF A PHASE-LOCKED LOOP CIRCUIT

(71) Applicant: NXP B.V., Eindhoven (NL)

(72) Inventors: Nenad Pavlovic, Eindhoven (NL); Chuang Lu, Eindhoven (NL); Vladislav Dyachenko, Eindhoven (NL)

(73) Assignee: NXP B.V., Eindhoven (NL)

( * ) Notice: Subject to any disclaimer, the term of this patent is extended or adjusted under 35 U.S.C. 154(b) by 6 days.

(21) Appl. No.: 18/239,309

(22) Filed: Aug. 29, 2023

(65) Prior Publication Data
US 2024/0080031 A1 Mar. 7, 2024

(30) Foreign Application Priority Data
Sep. 1, 2022 (EP) .................................... 22193436

(51) Int. Cl.
*H03L 7/099* (2006.01)
*H03B 5/08* (2006.01)
*H03L 7/093* (2006.01)

(52) U.S. Cl.
CPC ............... *H03L 7/099* (2013.01); *H03B 5/08* (2013.01); *H03L 7/093* (2013.01)

(58) Field of Classification Search
CPC ..................................................... H03L 7/099
USPC ......................................................... 331/1 R
See application file for complete search history.

(56) References Cited

U.S. PATENT DOCUMENTS

| | | | |
|---|---|---|---|
| 8,963,648 B2 | 2/2015 | Shanan | |
| 10,735,012 B2 | 8/2020 | Pavlovic | |
| 10,840,921 B2 * | 11/2020 | Konradsson | .......... H03L 7/0991 |
| 2016/0241301 A1 | 8/2016 | Pavlovic et al. | |
| 2017/0126237 A1 | 5/2017 | Pavao Moreira et al. | |
| 2017/0194973 A1 * | 7/2017 | Moehlmann | ............ H03L 7/093 |

OTHER PUBLICATIONS

Cherniak, D., "A 23-GHz Low-Phase-Noise Digital Bang-Bang PLL for Fast Triangular and Sawtooth Chirp Modulation", IEEE Journal of Solid-State Circuits, vol. 53, No. 12, Dec. 2018.
Eliezer, O., "Accurate Self-Characterization of Mismatches in a Capacitor Array of a Digitally-Controlled Oscillator", 2010 IEEE Circuits and Systems Workshop (DCAS), Oct. 17, 2010.
Wu, W., "A 56.4-to-63.4 GHz Multi-Rate All-Digital Fractional-N PLL for FMCW Radar Applications in 65 nm CMOS", IEEE Journal of Solid-State Circuits, vol. 49, No. 5, May 2014.

(Continued)

*Primary Examiner* — Joseph Chang

(57) ABSTRACT

A method of controlling a frequency-modulated oscillator 110 of a phase-locked loop circuit 100 is described, wherein the oscillator 110 comprises a bank of capacitors 413. The method comprises the steps of (i) switching a capacitor 414 of the bank of capacitors 413 to change an output frequency 1050 of an output signal 112 of the oscillator 110 from a first frequency 1051 to a second frequency 1052, (ii) determining a frequency information associated with the capacitor 414 and based on at least one of the first frequency 1051 and the second frequency 1052; and (iii) writing the frequency information to a look-up table 224, 225, 226 stored in a control unit 120 of the oscillator 110. A corresponding frequency-modulated oscillator 110 and phase-locked loop circuit 100 are also described.

18 Claims, 7 Drawing Sheets

(56) References Cited

OTHER PUBLICATIONS

Shanan, Hyman et al; "A 9-to-12GHz Coupled-RTWO FMCW ADPLL with 97fs RMS Jitter, −120dBc/Hz PN at 1MHz Offset, and with Retrace Time of 12.5ns and 2 µs Chirp Settling Time," ISSCC 2022/Session 8/ Advanced RF Building Blocks/ 8.3; pp. 146-147; (Feb. 2022).

* cited by examiner

METHOD OF CONTROLLING A FREQUENCY-MODULATED OSCILLATOR OF A PHASE-LOCKED LOOP CIRCUIT

CROSS-REFERENCE TO RELATED APPLICATIONS

This application claims the priority under 35 U.S.C. § 119 of European Patent application no. 22193436.7, filed on 1 Sep. 2022, the contents of which are incorporated by reference herein.

TECHNICAL FIELD

The present disclosure relates to a method of controlling a frequency-modulated oscillator of a phase-locked loop circuit and a corresponding frequency-modulated oscillator. Accordingly, the present disclosure may refer to the technical field of phase-locked loop circuits and their components.

TECHNICAL BACKGROUND

Phase-locked loops are widely employed in radio, telecommunications, computers and other electronic applications. They can be used to demodulate a signal, recover a signal from a noisy communication channel, generate a stable frequency at multiples of an input frequency, or distribute precisely timed clock pulses in digital logic circuits such as microprocessors. For example, in range sensing applications using radar technology, linearly frequency-modulated signals are used, which are generated by a phase-locked loop comprising a frequency-modulated oscillator. Distances to objects or persons are determined based on the frequency difference between transmitted and reflected waves. The accuracy of these distance measurements is very sensitive to deviations and errors in the linearly frequency-modulated signals.

OBJECT AND SUMMARY OF THE DISCLOSURE

An object of the present disclosure is to provide an oscillator for a phase-locked loop, which is capable of outputting frequency signals, in particular a sequence of frequency signals, with high accuracy.

In order to achieve this object, a method of controlling a frequency-modulated oscillator and a frequency-modulated oscillator according to the independent claims are provided.

According to an aspect of the present disclosure, a method of controlling a frequency-modulated oscillator of a phase-locked loop circuit is provided, wherein the oscillator comprises a bank of capacitors. The method comprises the steps of (i) switching a capacitor of the bank of capacitors to change an output frequency of an output signal of the oscillator from a first frequency to a second frequency, (ii) determining a frequency information associated with the capacitor and based on at least one of the first frequency and the second frequency, and (iii) writing the frequency information to a look-up table stored in a control unit of the oscillator. These steps may be carried out during a calibration mode of controlling the frequency-modulated oscillator.

According to a further aspect of the present disclosure, a frequency-modulated oscillator for a phase-locked loop circuit is provided. The oscillator comprises (i) a bank of capacitors and (ii) a control unit configured to (a) switch a capacitor of the bank of capacitors to change an output frequency of an output signal of the oscillator from a first frequency to a second frequency, (b) determine a frequency information associated with the capacitor and based on at least one of the first frequency and the second frequency, and (c) write the frequency information to a look-up table stored in the control unit.

According to a further aspect of the present disclosure, a phase-locked loop circuit is provided comprising the frequency-modulated oscillator described in the present disclosure.

In the context of the present disclosure, an "oscillator" may particularly refer to an electronic oscillator. The oscillator may be or comprise an electronic circuit that is configured to produce a periodic, oscillating output signal, for example a sine wave or a square wave or a triangle wave. The oscillator may be a feedback oscillator connected in a feedback loop with its output fed back into its input through a frequency selective electronic filter to provide feedback. For example, the oscillator may be an LC oscillator comprising an inductor and a capacitor, which are electrically connected. Other types of oscillators comprising a bank or plurality of capacitors may also be used.

In the context of the present disclosure, a "phase-locked loop circuit" may particularly denote an electronic circuit comprising a frequency-modulated oscillator. The oscillator may constantly adjust to match a reference frequency of a reference signal. For example, the oscillator may be or comprise a voltage-driven oscillator (VCO) or a digitally controlled oscillator (DCO). A phase-locked loop may be a closed-loop feedback control circuit that may be frequency-sensitive and/or phase-sensitive. Phase-locked loops may be used to generate, stabilize, modulate, demodulate, filter and/or recover a signal from a "noisy" communications channel. To that effect, the phase-locked loop may comprise a "phase detector" or phase comparator, which may be configured to compare the phases of two signals, e.g. of an input signal and a reference signal. The phase detector may further be configured to generate an output signal, e.g. an output signal in digital domain or a voltage. The phase detector may be or comprise a time to digital converter (TDC).

In the context of the present disclosure, the term "bank of capacitors" may refer to a plurality of capacitors. In some cases, even a single capacitor may form a bank. At least one capacitor of the bank, in particular all of the capacitors may be switchable, i.e. capable of being switched in and being switched out. A two-point modulation architecture of the phase-locked loop circuit may be used having two paths, a PLL path and a modulation path. The PLL path may be configured to lock to a base frequency for calibration. The bank of capacitors may form part of the modulation path. The bank of capacitors may comprise a plurality of capacitors which are similar, in particular have similar capacitances. The bank of capacitors may comprise two or more subbanks of capacitors, e.g. a subbank of coarse capacitors and a subbank of fine capacitors. The capacitances of the coarse capacitors may be greater than the capacitances of the fine capacitors. All capacitances of the coarse capacitors may be greater than each of the capacitances of the fine capacitors. An average of the capacitances of the coarse capacitors may be greater than an average of the capacitances of the fine capacitors.

A bank or subbank of capacitors may be arranged in a compact manner, e.g. with all the capacitors of the bank or subbank adjacent to each other and/or with a common housing for all the capacitors. At least some, in particular all of the capacitors, of the bank or subbank of capacitors may be connected in parallel, i.e. so that the individual capacitances of the capacitors add up to yield the total capacitance of the bank or subbank. The total capacitance may be the capacitance of the bank or subbank when all capacitors are switched in. However, alternatively or in addition, at least some, or even all capacitors of the bank or subbank may be connected in series.

In the context of the present disclosure, the expression "switching a capacitor of the bank of capacitors" may denote switching in the capacitor or switching out the capacitor. It may denote connecting the capacitor to an oscillator circuit or disconnecting the capacitor from the oscillator circuit. A capacitor may be "switched in" when the capacitor forms part of the oscillator circuit. The capacitor may be switched in by closing one or more electric connections between the oscillator circuit and the capacitor, e.g. by means of one or more electronic switches. A capacitor that is switched in may determine, together with all other capacitors that are switched in, the total capacitance of the bank and/or the total capacitance of an LC circuit of the oscillator. Correspondingly, a capacitor may be "switched out" when the capacitor does not form part of the oscillator circuit. The capacitor may be switched out by opening one or more electric connections between the oscillator circuit and the capacitor, e.g. by means of one or more electronic switches. The capacitor that is switched out may be irrelevant for the capacitance of the LC circuit. The capacitor, in particular all of the capacitors of the bank, may be configured to only adopt a state of being switched in or a state of being switched out, i.e. only these two states.

The capacitor may be switched in response to a control code, for example received from the control unit and/or from a filter of the phase-locked loop, in particular a digital loop filter. The capacitor may be switched in in response to a control code and/or switched out in response to a further control code. At least one capacitor, in particular all capacitors of the bank, may be switched in response to a corresponding control code. The control code and/or the further control code may be associated with the capacitor.

Switching in the capacitor or switching out the capacitor may both be suitable for determining the first frequency and the second frequency and/or a corresponding frequency difference based on the first frequency and the second frequency. The second frequency may be greater than the first frequency, in particular when the capacitor is switched out. The first frequency may be greater than the second frequency, in particular when the capacitor is switched in. When switching the capacitor, the state of all other capacitors of the bank of capacitors may be fixed, i.e. may remain either switched in or switched out. Switching in a capacitor may, but need not comprise leaving the capacitor in a switched-in state, if it is already switched in, in particular when receiving a corresponding control code. Switching out a capacitor may, but need not comprise leaving the capacitor in a switched-out stated, if it is already switched out, in particular when receiving a corresponding control code.

In the context of the present disclosure, the term "frequency information associated with the capacitor and based on at least one of the first frequency and the second frequency" may particularly denote any frequency-related information. It may be a frequency information based on the first frequency and the second frequency. For example, the frequency information may be or comprise a frequency difference based on the first frequency and the second frequency, in particular a frequency step associated with the capacitor. The frequency step may be based on an average frequency step, in particular averaged over all capacitors of the bank, and/or a differential nonlinearity (DNL) of the capacitor. The frequency step may correspond to a sum of the average frequency step and the differential nonlinearity of the capacitor. In the context of the present disclosure, a "differential nonlinearity" may particularly denote a deviation of the frequency step associated with the capacitor from the average frequency step. It may particularly denote a difference between frequency steps of each of two consecutive capacitors normalized to average step, wherein consecutive capacitors may be determined in terms of a predetermined order of the capacitors. The frequency step may be added to a base frequency associated with the capacitor. The base frequency may itself be defined as an overall base frequency added to a sum of respective frequency differences associated with all further capacitors of the bank which are switched out. In other words, the frequency information may be or comprise an integral nonlinearity (INL) associated with the capacitor and/or all further capacitors of the bank which are switched out. The overall base frequency may correspond to a frequency to which the PLL is locked. The overall base frequency may correspond to an output frequency of the output signal of the oscillator, when all capacitors are switched in. Alternatively, the overall base frequency may be defined as an output frequency of the output signal of the oscillator, when all capacitors are switched out. In this case, the frequency information may be or comprise the overall base frequency minus the sum of frequency differences associated with all further capacitors which are switched in.

The "frequency difference based on the first frequency and the second frequency difference" may be the difference between the first frequency and the second frequency or the difference between the second frequency and the first frequency. Determining the frequency difference may involve an averaging procedure over several measurements of the first and/or second frequencies. The frequency difference may be associated with a respective control code.

In the context of the present disclosure, the term "look-up table" or LUT may particularly denote statically defined information, which may be employed during normal operation of the oscillator. The look-up table may be stored in memory of the control unit. At least part, in particular all information comprised in the look-up table may be generated during a calibration mode of the method of controlling the frequency-modulated oscillator. The look-up table may be consulted during of a mode of normal operation or normal mode of the method of controlling the frequency-modulated oscillator. The look-up table may, but need not be refined during the mode of normal operation. The look-up table may comprise an array of information entries. The look-up table may comprise information entries which associate the frequency information with the corresponding capacitor and/or a corresponding control code.

As an example, in the look-up table, frequency differences may be recorded and/or cumulative sums of frequency differences may be recorded. A cumulative sum may add up all frequency differences associated with all capacitors which are switched in or may add up all frequency differences associated with all capacitors which are switched out. The cumulative sum may include an overall base frequency associated with a state when all capacitors are switched in or with a state when all capacitors are switched out. The sum of frequency differences may be added to the base frequency or may be subtracted from the base frequency. Thus, the frequency information written to the look-up table may be or comprise the frequency difference and/or a cumulative sum including or excluding the base frequency. Alternatively or in addition, in the look-up table, scaling factors may be recorded.

In the look-up table, control codes may be recorded, which may be associated with respective capacitors being switched. A capacitor control code, when fed to the oscillator, may be configured to switch in a corresponding capacitor and/or switch in a corresponding sequence of capacitors, e.g. sequence of capacitors in a predetermined order. A capacitor control code, when fed to the oscillator, may be configured to switch out a corresponding capacitor and/or switch out a corresponding sequence of capacitors, e.g. sequency of capacitors in a predetermined order. The look-up table may comprise one or more sub-tables, e.g. a separate sub-table for each bank or subbank of capacitors and/or a sub-table for scaling factors. The subtables may be stored at different locations of the memory of the control unit.

In the context of the present disclosure, the term "control unit" may refer to digital logic circuitry adapted for controlling the oscillator, in particular for switching in and/or out individual capacitors of the bank of capacitors, in particular in response to respective control codes. The control unit may comprise a calibration unit, which may be configured to control the oscillator during a calibration mode of operation, and/or may comprise an operation control unit, which may be configured to control the oscillator during a normal mode of operation. The look-up table may be stored in the calibration unit and/or the operation control unit. Copies of the table may be stored in these units.

According to an exemplary embodiment, the present disclosure may be based on the idea to provide an oscillator control for a phase-locked loop based on quantization in the frequency domain. Such an oscillator control may be referred to as piecewise linear (PWL) control. The quantization is enabled by calibration in the frequency domain. The calibration in the frequency domain may be capable of taking into account a nonlinear relation between a frequency output and the tank capacitance of an LC oscillator. The calibration in the frequency domain may further be able to take into account a differential and/or integral nonlinearity (DNL/INL) of different banks or subbanks of the oscillator, in particular due to unit capacitor mismatches. It may be capable of taking into account a unit capacitor step dependency on the fringe capacitance, i.e. on the state of nearby capacitors. In other words, frequency differences associated with individual capacitors may depend on whether further capacitors are switched in or are switched out, in particular nearby capacitors of the bank. The calibration in the frequency domain may further be able to take into account a frequency-dependent effective capacitance due to trace inductances, when individual capacitors are connected to the oscillator. Thus, the inductances of electrical connections, when individual capacitors are switched in, may be taken into account. Finally, the calibration in the frequency domain may be able to take into account a change of tank capacitance due to a capacitor amplitude change, as a tank Q, i.e. a tank quality factor, may change with frequency. In summary, the calibration procedure in the frequency domain may be capable of taking into account a number of phenomena, which may affect the quality of oscillator control, but which in general are difficult to calculate explicitly.

DESCRIPTION OF EXEMPLARY EMBODIMENTS

In the following, further exemplary embodiments of the circuit and the corresponding method of operating the circuit will be explained.

According to an exemplary embodiment, the oscillator comprises a variable LC circuit. The variable LC circuit may comprise an inductor, in particular an inductor having a variable and/or controllable inductance, and a capacitor, in particular a capacitor having a variable and/or controllable capacitance. The inductance may not be variable. The LC circuit may be referred to as a tank circuit, the capacitance, in particular the total capacitance of the LC circuit, may be referred to as tank capacitance, and/or the inductance, in particular the total inductance of the LC circuit may be referred to as tank inductance. The capacitors of the bank of capacitors, in particular when being switched in, may form part of the LC circuit. The capacitors of the bank of capacitors may determine or co-determine the capacitance of the LC circuit. Such an embodiment may be advantageous to implement a frequency-modulated oscillator having a bank of capacitors.

According to a further exemplary embodiment, the capacitor is switched in and out repeatedly and the frequency difference is determined based on an average of differences between respective first and second frequencies. The frequency difference may be determined, when the capacitor is switched out and/or when the capacitor is switched in. The average may be an arithmetic average. The average may be based on at least two measurements, in particular on at least five measurements, in particular on at least twenty measurements. Determining the frequency difference based on an average may allow to control for various statistical influences, which cannot otherwise be taken into account.

According to a further exemplary embodiment, the capacitor is switched, in particular switched in or switched out, in response to a control code received from a calibration unit. The calibration unit may, but need not form part of the control unit. The control code may be received by the oscillator and/or the bank of capacitors of the oscillator. Such a control code may be associated with a capacitor to be switched. It may be associated with a capacitor to be switched in and/or with a sequence of capacitors to be switched in, in particular in a predetermined order. A control code may be associated with a capacitor to be switched out and/or with a sequence of capacitors to be switched out, in particular in a predetermined order.

According to a further exemplary embodiment, the method further comprises (i) receiving, by the control unit, a control input signal associated with a desired frequency of the output signal to be output by the oscillator, (ii) reading the frequency information from the look-up table, (iii) and switching in or switching out the capacitor depending on the frequency information. These steps may be carried out during a mode of normal operation of the method of controlling the frequency-modulated oscillator. Switching in may comprise leaving the capacitor in a switched-in state if it is already switched in. Switching out may comprise leaving the capacitor in a switched-out state if it is already switched out. The capacitor may be switched out, when the desired frequency is greater than the INL associated with the given capacitor, in particular for a predefined switching sequence. Already switched-out capacitors may contribute to the INL of the next capacitor in the switching sequence.

Such an embodiment may be advantageous as it demonstrates how the information stored in the look-up table generated in a calibration mode of the method of controlling the oscillator can be used during normal operation of the oscillator, i.e. during a normal mode of the method of controlling the oscillator.

According to a further exemplary embodiment, the desired frequency derives from a desired frequency sequence, which varies linearly in time, in particular a linear chirp frequency sequence. The desired frequency sequence may refer to a sequence in time of desired frequencies. It may be a discrete or a continuous frequency sequence. The desired frequency sequence may be a periodic frequency sequence repeating or at least approximately repeating a specific frequency sequence unit over time. A linear chirp frequency sequence may be a sequence, in which the frequency linearly increases (up-chirp) and/or linearly decreases (down-chirp) with time. Linearly varying frequency sequences may be particularly useful for certain applications of phase-locked loops such as radar ranging. They may provide good measurement accuracy, e.g. for distance measurements over a range of distances.

According to a further exemplary embodiment, the method further comprises determining a phase error by means of a phase detector of the phase-locked loop circuit and updating the frequency information based on the phase error. These steps may be carried out during a normal mode of operation of the method of controlling the frequency-modulated oscillator. The phase error may be determined when a capacitor is switched in and/or when a capacitor is switched out. The frequency information to be updated may include a respective frequency difference, a respective base frequency and/or an overall base frequency. The phase error may be determined over multiple chirps. The background calibration based on phase error may take into account code transition timestamp information. Such an embodiment may be advantageous because it may be able to take into account temperature drift during a normal mode of operation.

According to a further exemplary embodiment, a circuit path between a phase detector of the phase-locked loop circuit and the oscillator is interrupted when switching the capacitor and/or when determining the frequency information, wherein the method further comprises after switching the capacitor and/or after determining the frequency information, reconnecting the circuit path between the phase detector and the oscillator, in particular to determine and/or at least partially compensate a temperature drift of the oscillator. These steps may be carried out during a calibration mode. In other words, the oscillator may be locked back in the phase-locked loop after the frequency information is determined, e.g. a frequency difference is measured, in order to remove any temperature drift of the capacitor. Thus, such an embodiment may be advantageous to control for background errors such as temperature drift.

According to a further exemplary embodiment, determining the frequency information comprises (i) feeding the output signal having the first frequency to a divider of the phase-locked loop circuit and controlling the divider by means of a first divider control signal so that a divider output signal corresponds to a reference signal having a reference frequency, (ii) feeding the output signal having the second frequency to the divider and controlling the divider by means of a second divider control signal so that the divider output signal corresponds to the reference signal having the reference frequency, and (iii) determining the frequency information based on at least one of the first divider control signal and the second divider control signal. The above steps may be carried out during a calibration mode of the method of controlling the oscillator. The first frequency may correlate with the first divider control signal and/or the second frequency may correlate with the second divider control signal.

In the context of the present disclosure, the term "divider" may particularly denote a circuit which generates an output signal with a parameter having a value that is a fraction of a corresponding value of the same parameter of an input signal of the circuit. The fraction may be determined by a divider control signal. The divider may be a frequency divider. For example, the divider may generate an output signal with a frequency that is a fraction of a corresponding frequency of an input signal of the divider. The fraction may be a rational number. The first frequency may be or may be based on the reference frequency divided by the fraction associated with the first divider control signal. The second frequency may be or may be based on the reference frequency divided by the fraction associated with the second divider control signal. Whether a frequency of the divider output signal corresponds to the reference frequency of the reference signal may be determined by means of a phase detector of the phase-locked loop. Such an embodiment may be advantageous to determine the frequency information in a particularly efficient manner using existing components of the phase-locked loop.

According to a further exemplary embodiment, the method further comprises (i) subsequently switching at least one further capacitor of the bank of capacitors so that, for every further capacitor being switched, the output frequency changes from a respective further first frequency to a respective further second frequency, (ii) for every further capacitor being switched, determining a respective further frequency information associated with the respective further capacitor and based on at least one of the respective further first frequency and the respective further second frequency, and (iii) for every further capacitor being switched, writing the respective further frequency information to the look-up table stored in the control unit. The above steps may be carried out during a calibration mode.

The method may start with all capacitors being switched in and subsequently switching out all capacitors of the bank of capacitors, in particular in a predetermined order. The frequency, when all capacitors are switched in, may be an overall base frequency. The respective frequency differences may be added to the overall base frequency, e.g. according to the predetermined order. The respective frequency differences may correspond to respective frequency steps, which may take into account respective differential nonlinearities (DNL). Cumulative frequency differences, i.e. the sum of all frequency differences of the switched-out capacitors, in particular when added to the overall base frequency, may correspond to integral nonlinearities (INL). The respective frequency steps, respective DNL and/or the respective INL may be written to the look-up table as respective frequency information. Alternatively, the method may start by having all capacitors switched out and subsequently switching in all capacitors of the bank of capacitors. In this case, the sum of all frequency differences of the switched-in capacitors may be subtracted from an overall base frequency associated with the state, when all capacitors are switched out.

Such an embodiment may be advantageous to efficiently calibrate the oscillator, in particular when the capacitors are switched in a predetermined order. It may be advantageous to take into account various errors, which may potentially arise, e.g. the nonlinear relation between frequency and tank capacitance. This nonlinear relation may be defined by the following equations $$\Delta f = 2\pi^2 f^3 L \Delta C$$

$$1/f = [L(C - \Sigma_{k=0,\ldots,MOD-1} a_k \Delta C_k^{MOD} - \Sigma_{k=0,\ldots,TR-1} b_k \Delta C_k^{TR})]^{1/2},$$

where $\Delta C_k^{MOD}$, $\Delta C_k^{TR}$ are DNL of capacitor banks, C is a fixed capacitance of the tank and L is the inductance of the tank. Furthermore, writing frequency information associated with the integral nonlinearities to the look-up table may be advantageous, because less calculation steps have to be carried out "on the fly" during a normal mode of operation allowing for a faster implementation of the normal mode of operation.

According to a further exemplary embodiment, the capacitor and the at least one further capacitor are switched, in particular are switched in or are switched out, in a predetermined order. All capacitors may be switched in subsequently in the predetermined order. All capacitors may be switched out subsequently in the predetermined order. The order when switching out may be the reverse of the order when switching in. The capacitors may be switched in the predetermined order during the calibration mode and/or they may be switched in the predetermined order during the normal operation mode. Switching in or switching out the capacitors in a predetermined order may be advantageous, because the capacitor frequency step may be measured at the frequency where it will be used. For example, the respective frequency difference may depend not only on the respective capacitor being switched, but may depend also on which further capacitors are already switched in or are switched out, for example on the state of nearby capacitors of the bank.

According to a further exemplary embodiment, the capacitors of the bank of capacitors are coarse capacitors and the oscillator further comprises a bank of fine capacitors having capacitances smaller than the capacitances of the coarse capacitors. The method further comprises the steps of (i) for a fixed state of the coarse bank, subsequently switching, in particular switching in or switching out, at least one fine capacitor of the bank of fine capacitors so that, for every fine capacitor being switched, the output frequency changes from a respective first fine frequency to a respective second fine frequency, (ii) for every fine capacitor being switched, determining a respective fine frequency information associated with the respective fine capacitor and based on at least one of the respective first fine frequency and the respective second fine frequency, in particular on the first fine frequency and the second fine frequency, and (iii) for every fine capacitor being switched, writing the respective fine frequency information to the look-up table. The above steps may be carried out in a calibration mode.

Respective fine frequency information may, but need not be written to the look-up table in an analogous manner as the coarse frequency information. For example, respective fine frequency information may comprise a corresponding frequency difference, e.g. a corresponding frequency step, corresponding DNL, and/or a corresponding cumulative fine frequency difference, e.g. INL. The cumulative fine frequency difference may be the sum of all fine frequency differences of all fine capacitors being switched in or the sum of all fine frequency differences of all fine capacitors being switched out. The sum may be added to are subtracted from a frequency corresponding to the fixed state of the coarse bank. The fixed state of the coarse bank may be defined by which capacitors are switched in and which are switched out. The fixed state of the coarse bank may be a state, where all coarse capacitors are switched in, or it may be a state, where all coarse capacitors are switched out. The frequency corresponding to the fixed state of the coarse bank may correspond to the sum of all frequency differences associated with the coarse capacitors being switched out plus the base frequency corresponding to a frequency, when all coarse capacitors are switched in.

Having a bank of fine capacitors in addition to a bank of coarse capacitors may allow for an efficient realization of output frequencies of the output signal of the oscillator with high accuracy. The fine capacitors may be employed to realize frequencies between different coarse capacitor states.

According to a further exemplary embodiment, the method further comprises (i) determining a total fine frequency difference between a state, when all fine capacitors are switched in for the fixed state of the coarse bank, and a state, when all fine capacitors are switched out for the fixed state of the coarse bank, (ii) for a further fixed state of the coarse bank different from the fixed state of the coarse bank, determining a further total fine frequency difference between a state, when all fine capacitors are switched in for the further fixed state of the coarse bank, and a state, when all fine capacitors are switched out for the further state of the coarse bank, (iii) determining a scaling factor for the further fixed state of the coarse bank based on the ratio between the total fine frequency difference and the further total fine frequency difference, and (iv) writing the scaling factor to the look-up table. A respective scaling factor may be determined for every further fixed state of the coarse bank. The above steps may be carried out during a calibration mode.

The fixed state of the coarse bank may be a state, where all coarse capacitors are switched in. Such a state may correspond to a minimal base frequency. In that case, the further fixed state of the coarse bank may be any other state of the coarse bank, i.e. a state where at least one coarse capacitor is switched out. The fixed state of the coarse bank may be a state, where all coarse capacitors are switched out. Such a state may correspond to a maximal modulation frequency and/or an overall base frequency. In that case, the further fixed state of the coarse bank may be any other state of the coarse bank, i.e. a state where at least one coarse capacitor is switched in.

Determining the scaling factor may be advantageous because the calibration of the individual fine capacitors needs to be carried out only once for one fixed state of the coarse bank. For all other further fixed states of the coarse bank, the corresponding frequencies when individual fine capacitors are switched in or out can be determined based on the original calibration of the individual fine capacitors and on the respective scaling factor.

According to a further exemplary embodiment, the method further comprises (i) receiving, by the control unit, a desired frequency of the output signal to be output by the oscillator, (ii) consulting the look-up table to determine the state of the coarse bank and the coarse capacitors to be switched, (iii) determining a desired residual frequency based on the desired frequency and a frequency corresponding to the state of the coarse bank, (iv) consulting the look-up table to determine based on the residual frequency and on a scaling factor defined by the state of the coarse bank the state of the fine bank and the fine capacitors to be switched in order to realize the desired residual frequency, and (iv) switching the determined coarse capacitors and the determined fine capacitors. These steps may be carried out during a normal mode of operation of the method of controlling the oscillator.

The state of the coarse bank may be determined by the coarse capacitors that need to be switched in and/or the coarse capacitors that need to be switched out. Equally, the state of the fine bank may be determined by the fine capacitors that need to be switched in and/or the fine capacitors that need to be switched out. The scaling factor may be defined by the state of the coarse bank in terms of the above-described method of determining the scaling factor for a given further fixed state of the coarse bank. The desired frequency may be generated by a frequency generator, in particular a chirp generator.

The coarse capacitors to be switched in and/or out may be determined based on the frequency information as well as respective further frequency information. The fine capacitors to be switched in and/or out may be determined based on the respective fine frequency information. The desired residual frequency may correspond to the difference between the frequency corresponding to the state of the coarse bank and the desired frequency. The residual frequency may be multiplied or divided by the scaling factor in order to determine the fine capacitors to be switched in.

Such an embodiment may be advantageous to efficiently realize desired frequencies or desired frequency sequences with good accuracy. The method may require comparably few calibration steps due the use of both a fine bank and a coarse bank as well as due to the use of the scaling factor. Correspondingly, a small memory of the control unit for storing the look-up table may be sufficient. Also, relatively few steps may need to be carried out during a normal mode of operation allowing for a fast operation of a frequency-modulated oscillator for a phase-locked loop. The embodiment may be advantageous because complex oscillator control calculations for a two-point modulation may be replaced by a threshold search in the normalized frequency domain.

The aspects defined above and further aspects of the present disclosure are apparent from the examples of embodiment to be described hereinafter and are explained with reference to these examples of embodiment. The disclosure will be described in more detail hereinafter with reference to examples of embodiment but to which the disclosure is not limited.

BRIEF DESCRIPTION OF THE DRAWINGS

The illustrations in the drawings are schematic. In different drawings, similar or identical elements may be provided with the same reference signs.

DESCRIPTION OF THE DRAWINGS

Figure 1:
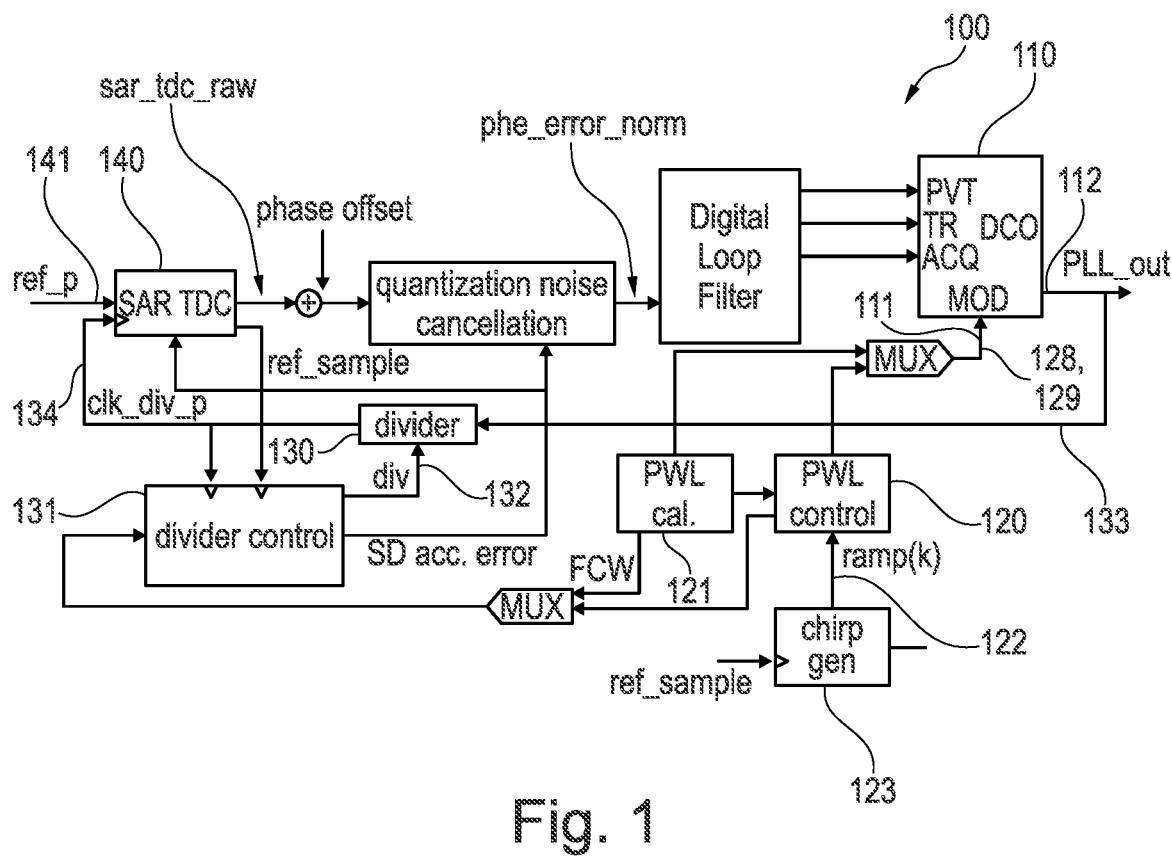
FIG. 1 shows a phase-locked loop circuit according to an exemplary embodiment of the present disclosure.

FIG. 1 shows a phase-locked loop circuit 100. The phase-locked loop circuit 100 comprises a frequency-modulated oscillator 110 comprising a bank of capacitors 413 (not shown, see FIGS. 4 and 5) and a control unit 120. The control unit 120 is configured to (i) switch a capacitor 414 of the bank of capacitors 413 to change an output frequency of an output signal 112 of the oscillator 110 from a first frequency to a second frequency, (ii) determine a frequency information associated with the capacitor 414 and based on at least one of the first frequency and the second frequency, and (iii) write the frequency information to a look-up table 224, 225, 226 (not shown, see FIG. 2) stored in the control unit 120.

FIG. 1 shows an all-digital phase-locked loop (ADPLL) architecture. The ADPLL includes a phase detector 140, here a successive approximation register (SAR) Time-to-Digital Converter (TDC), a quantization noise cancelling unit, a digital loop filter, an oscillator 110, here a digitally controlled oscillator (DCO), a frequency divider 130, and a divider control unit 131. The ADPLL is used to compare the phase of a reference signal 141 with the phase of a signal that is derived from the output signal 112 of the ADPLL and to adjust the oscillator 110 to keep the phases of the two signals matched. The ADPLL architecture also supports two-point modulation through the frequency generator 123, here a chirp generator, the DCO modulation path control (piecewise linear (PWL) control) and DCO PWL calibration blocks. The oscillator 110 has the following inputs: PLL locking inputs (PVT, TR, ACQ) and a modulation input 111 (MOD).

Figure 2:
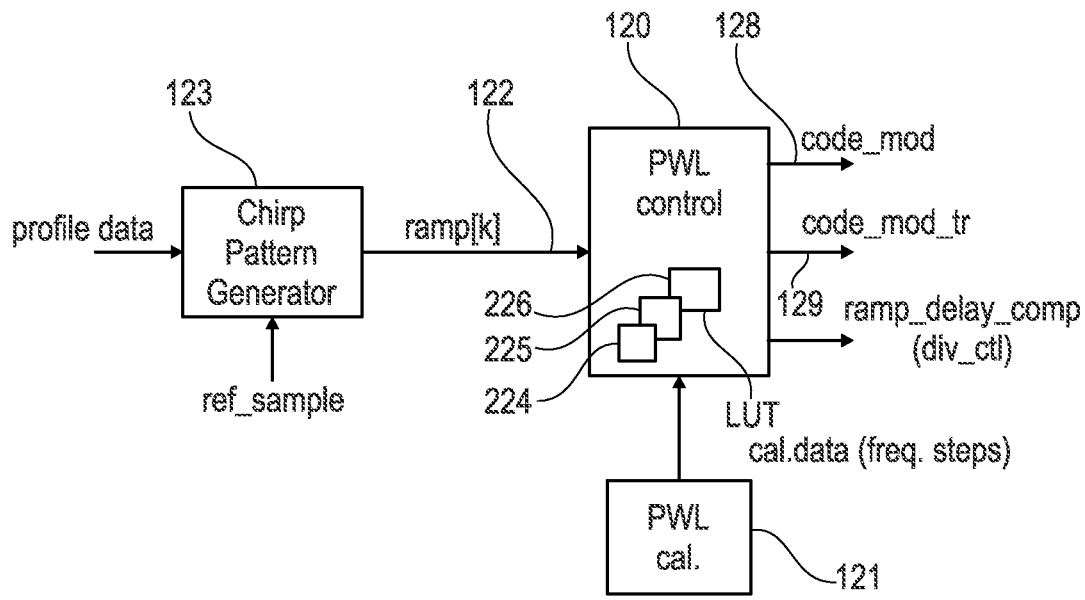
FIG. 2 shows a control unit for a frequency-controlled oscillator according to an exemplary embodiment of the present disclosure.

FIG. 2 shows a control unit 120 for a frequency-controlled oscillator 110. A frequency generator 123, here a chirp generator, generates a control input signal 122 associated with a desired frequency or a desired frequency sequence. Given the desired frequency, the control unit 120 consults the look-up tables 224, 225, 226 to determine which coarse capacitors of a bank of coarse capacitors need to be switched in or out and which fine capacitors of a bank of fine capacitors need to be switched in or out. The control unit generates the corresponding coarse capacitor control code 128 and fine capacitor control code 129 to control the oscillator 110 accordingly.

The PWL control unit 120 calculates the oscillator control codes 128, 129 that will produce the desired frequency point of the chirp signal at the oscillator output 112. Due to the dynamic range/resolution trade off, the oscillator modulation path (MOD) is usually constructed from multiple capacitor banks. The oscillator control for the LC oscillator, as shown in FIG. 2, has a coarse (code_mod) capacitor bank and a fine (code_mod_tr) capacitor bank.

Figure 3:
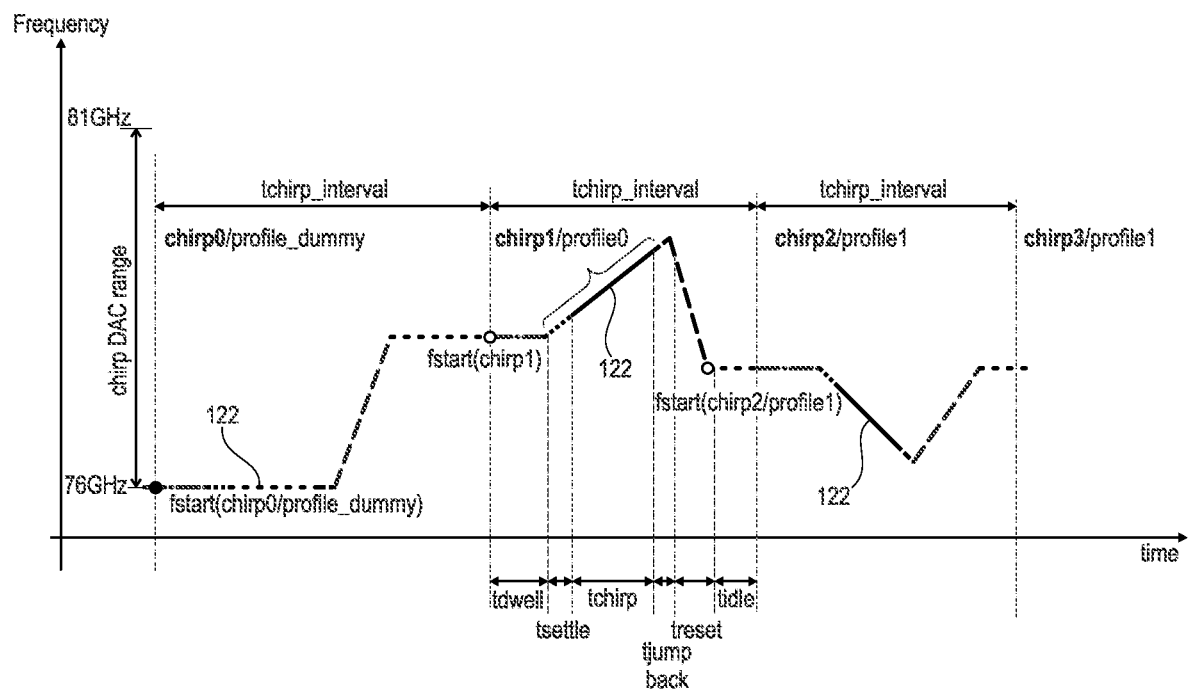
FIG. 3 shows a desired frequency sequence generated by a frequency generator according to an exemplary embodiment of the present disclosure.

FIG. 3 shows a desired signal 122, here a chirp signal, generated by a frequency generator, here a chirp generator. The chirp generator creates the chirp signal 122 in the normalized frequency domain, ramp(k), at each timestamp point of the ref_sample clock based on user defined chirp parameters, for instance fstart (start channel), chirp_amplitude as well as different timing parameters: tdwell, tsettle, tchirp, tjump_back, treset, tidle.

Figure 4:
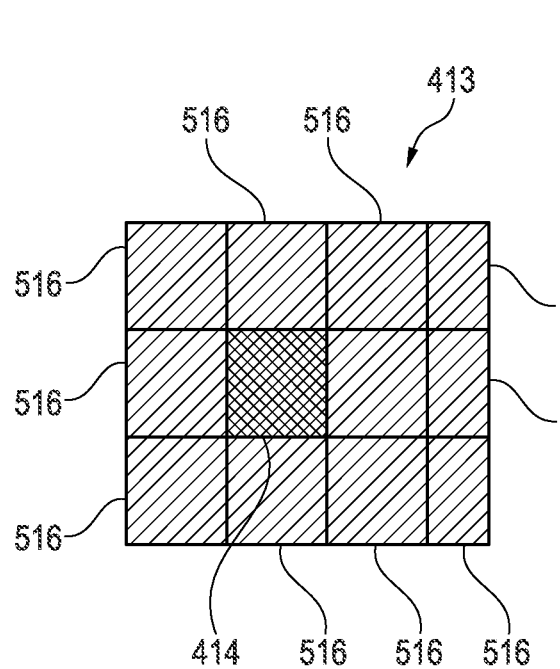
FIGS. 4 and 5 show different states of a capacitor bank according to an exemplary embodiment of the present disclosure.
Figure 5:
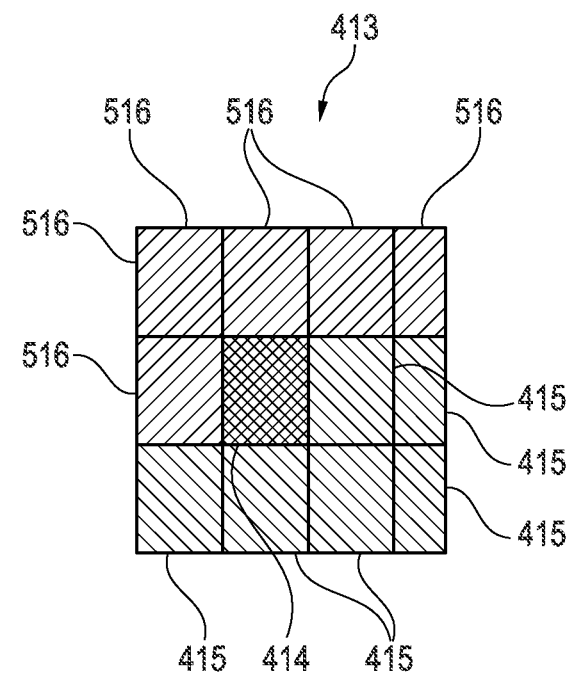

FIGS. 4 and 5 show different states of a bank of capacitors 413. In each Figure, one capacitor 414 is toggled, i.e. is either switched in or is switched out, to determine respective frequency information for the look-up table. FIGS. 4 and 5 illustrate different toggling procedures. FIG. 4 illustrates one capacitor disabled (OCD) calibration, in which all other capacitors 516 except the toggled capacitor 414 are switched in. FIG. 5 illustrates piecewise linear (PWL) calibration, in which some capacitors 516 are switched in and other capacitors 415 are switched out. In PWL calibration, capacitors are switched in subsequently or are switched out subsequently.

Figure 6:
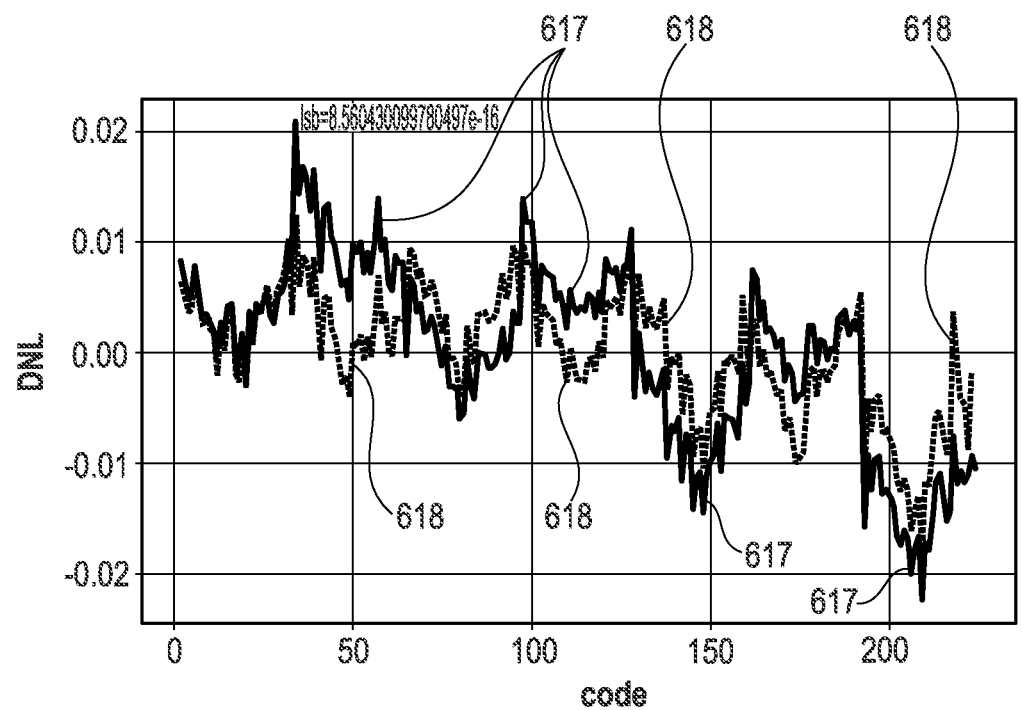
FIG. 6 shows differential nonlinearity of capacitors, when subsequent capacitors are switched, according to an exemplary embodiment of the present disclosure.

FIG. 6 shows differential nonlinearity (DNL) of the frequency step for each capacitor code. Differences between the calibration procedures of FIGS. 4 and 5 are illustrated by comparing DNL 617 resulting from PWL calibration and DNL 618 resulting from OCD calibration. The differences between the calibration procedures illustrate the unit capacitor step dependency on the fringe cap, i.e. dependency on the state of nearby capacitors.

Figure 7:
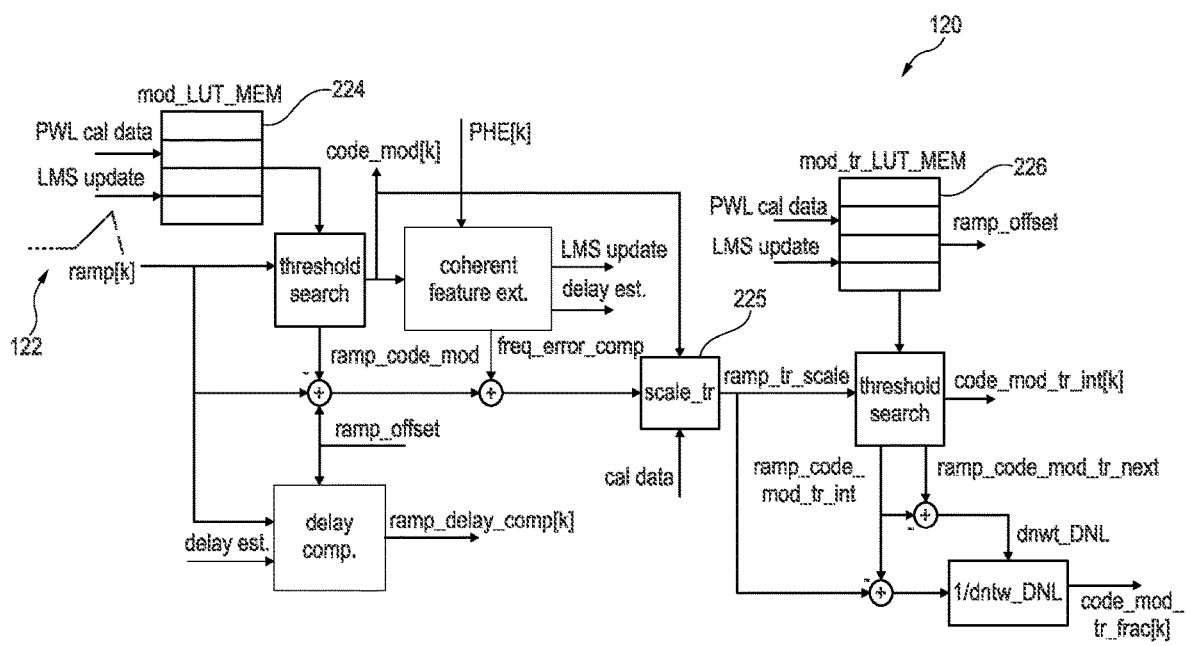
FIG. 7 illustrates a method of controlling an oscillator according to an exemplary embodiment of the present disclosure.

FIG. 7 shows an embodiment of the PWL control for the oscillator 110 with two banks. The PWL calibration stores, in the normalized frequency domain, the DCO INL data in memory (mod_LUT_MEM, MOD_tr_LUT_MEM) for each DCO input code of modulation banks. The chirp frequency point quantization process starts by a direct search in the normalized frequency domain to find the coarse code (code_mod[k]) that produces the closest frequency (ramp_code_mod) that is below the required chirp frequency point (ramp[k]). The residual error is then scaled (scale_tr) and the quantization process is repeated to find the fine bank code (code_mod_tr_int[k]). When the fine bank is operated as a high speed re-quantizer the fractional part (code_mod_tr_frac[k]) of the DCO control is calculated from the residual frequency error and the next code DNL (dntw_DNL). The scaling allows for re-use of the fine modulation bank at each bin of the coarse bank. For ideal LC DCO the scaling factor can be precalculated by using the relation between the frequency step $\Delta f$ and $\Delta C$ due to the unit capacitor switching at a given frequency.

Figure 8:
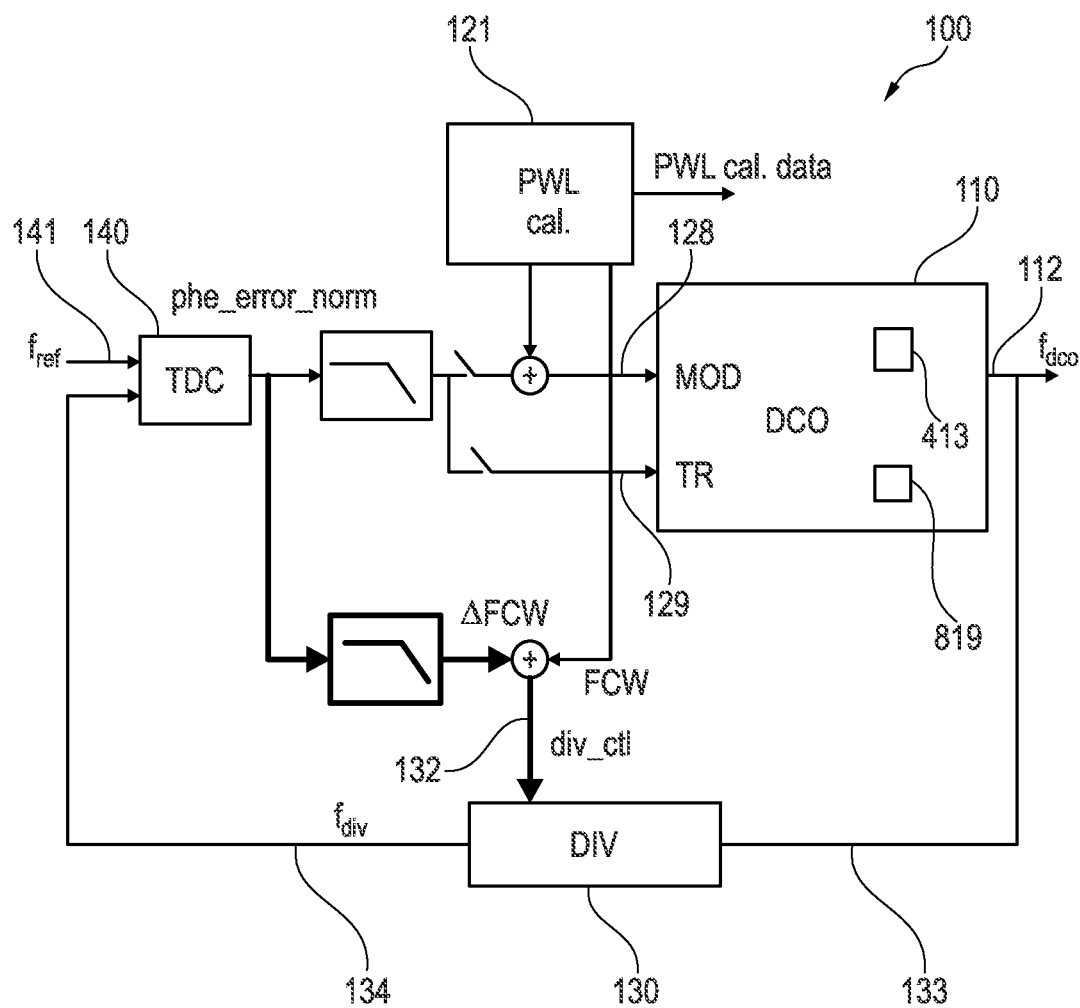
FIG. 8 shows a phase-locked loop circuit in a calibration mode according to an exemplary embodiment of the present disclosure.
Figure 9:
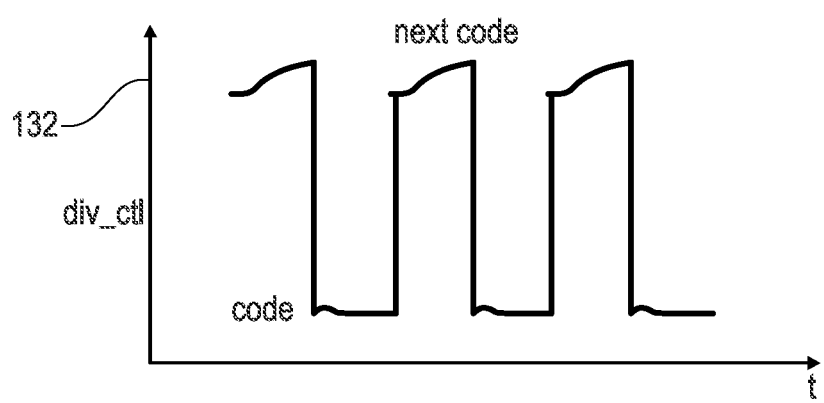
FIG. 9 shows a divider control signal according to an exemplary embodiment of the present disclosure.
Figure 10:
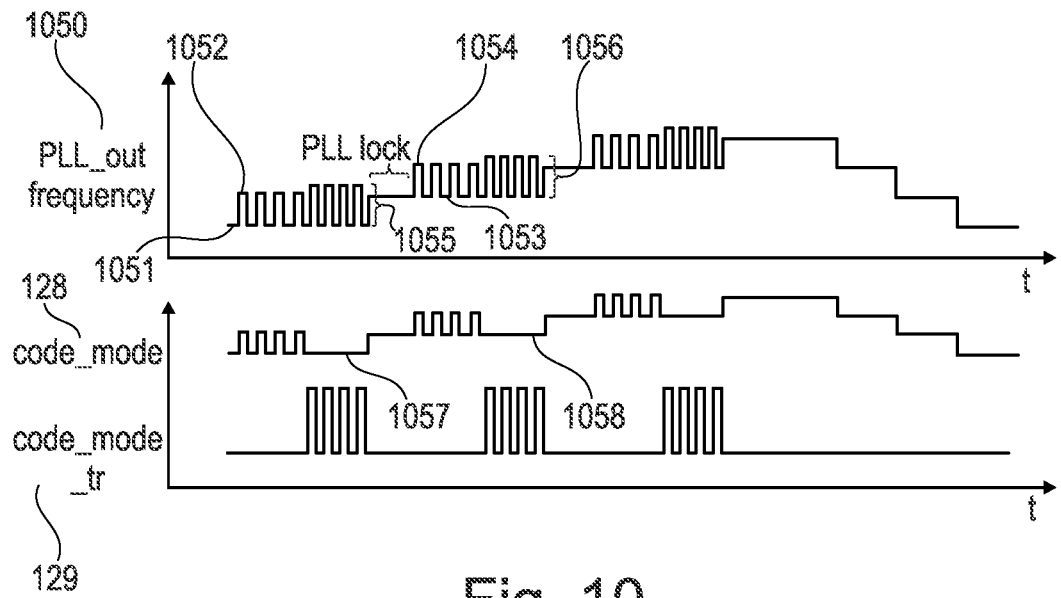
FIG. 10 illustrates a method of controlling an oscillator during a calibration mode according to an exemplary embodiment of the present disclosure.

FIGS. 8 to 10 illustrate the DCO PWL calibration by measuring the INL of each bank in the normalized frequency domain. The ADPLL configuration during the DCO INL measurement is shown in FIG. 8. The PWL calibration starts from the current locked channel FCW. The oscillator 110 is disconnected from the PLL loop 100 and the DCO input code 128, 129 is controlled by the PWL calibration block 121. The divider input 132 is connected in the PLL loop 100. The div_ctl input 132 of the divider 130 will change until it matches (in normalized domain) the frequency at the output 112 of the oscillator 110.

As shown in FIG. 9, to calibrate the DCO step, the PWL calibration toggles the DCO input 128, 129 between current code and the next code. The DCO frequency step is calculated from the difference of the divider input 133 for two toggle states. To remove the DCO noise average frequency step is calculated from multiple toggling measurements. To calibrate the next DCO code the divider input (FCW) is incremented by the frequency step of the current DCO code and next modulation code is applied. The divider input is saved as threshold to the INL LUT at the address of the next code. Before the next code is toggled the DCO is temporarily connected to the PLL loop to remove any DCO drift during calibration.

As shown in FIG. 10, the toggle procedure is then repeated for the next code. In this way PWL calibration "walks" in a statistical way over the DCO frequency characteristic. The coarse bank INL calibration is shown. The scaling LUT calibration is interleaved with the coarse bank calibration if the coarse code is fixed, and the toggling of the fine bank is done to measure the fine bank step at a given frequency. The ratio of the fine bank step for the first code and the fine bank step for the current coarse code gives the scaling factor for the current coarse bin when the DCO cannot be approximated as ideal LC DCO.

FIG. 10 illustrates a toggling procedure in order to determine respective frequency information, further frequency information and a scaling factor. The output frequency 1050 of the oscillator over time is shown in the upper part, the corresponding coarse capacitor control codes 128 and fine capacitor control codes 129 being received by the oscillator over time are shown in the lower part of the Figure. First, a coarse capacitor is switched to change the output frequency 1050 from a first frequency 1051 to a second frequency 1052. The capacitor is switched repeatedly to implement an averaging procedure. Then, for a fixed state of the coarse bank 1057, when the capacitor is switched in, in particular when all capacitors are switched in, all fine capacitors are repeatedly switched in and switched out to yield a total fine frequency difference 1055. Next, a further coarse capacitor is switched to change the output frequency from a further first frequency 1053, corresponding to the second frequency 1052, to a further second frequency 1054. For the further fixed state of the coarse bank 1058, when the capacitor is switched out, but the further capacitor is switched in, all fine capacitor are repeatedly switched in and switched out to yield a further total fine frequency difference 1056. A scaling factor for the further fixed state of the coarse bank 1058 can be determined by calculating the ratio between the total fine frequency difference 1055 and the further total fine frequency difference 1056. These steps are then repeated for a still further capacitor being switched.

Figure 11:
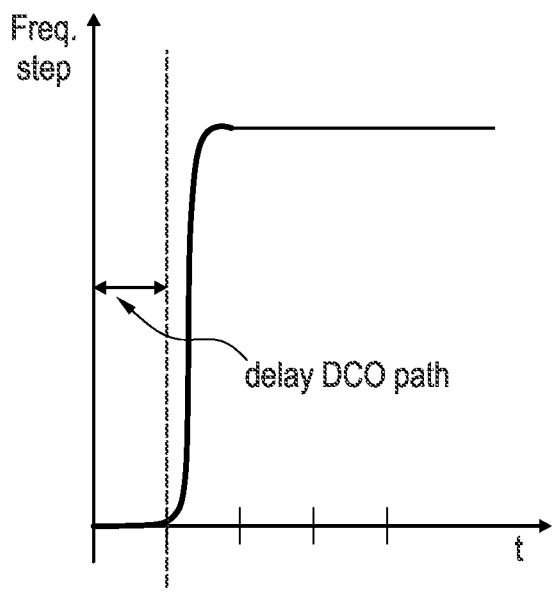
FIGS. 11 and 12 illustrate a path delay calibration according to an exemplary embodiment of the present disclosure.
Figure 12:
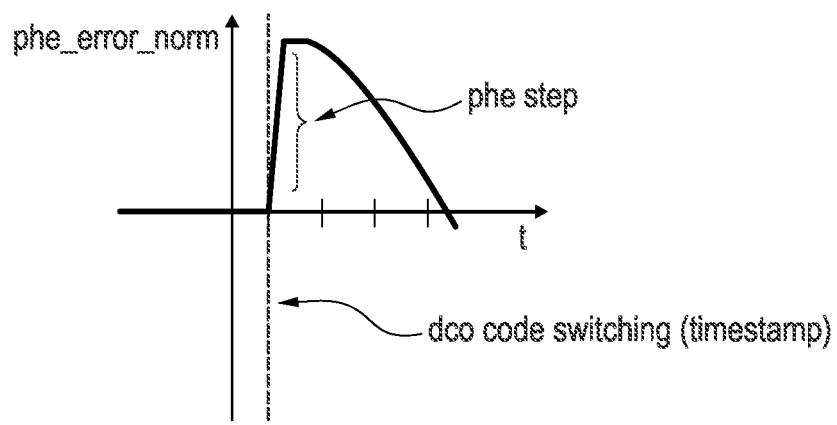

FIGS. 11 and 12 illustrate a path delay calibration. The delay of the DCO control path must be taken into account during two-point modulation. The delay compensation is done by modifying the divider input stream as:

$$\text{ramp\_delay\_comp}[k]=\text{ramp}[k-1]\varepsilon+(1-\varepsilon)\text{ramp}[k],$$

where $\varepsilon$ is a delay of the DCO path (normalized to ref_sample period). The DCO control path delay, if not compensated, produces a phase error step during the coarse bank switching as shown in FIG. 12. The DCO path delay can be calculated as ratio of measured phase error step and the PWL calibrated frequency step of the coarse bank for a given input code.

Figure 13:
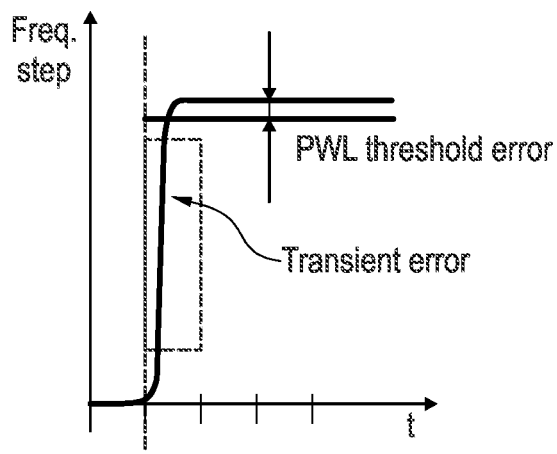
FIGS. 13 and 14 illustrate a transient error and threshold error calibration according to an exemplary embodiment of the present disclosure.
Figure 14:
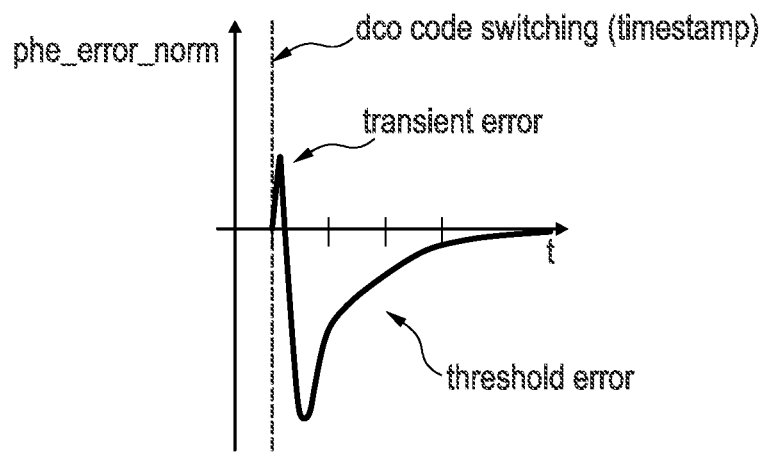

FIGS. 13 and 14 illustrate a transient error and a threshold error. The PWL generator has a timestamp information of each modulation bank input code transition. During the chirping operation, the phase error will be correlated with the input code transitions. If the DCO characteristic is changing, for instance due to temperature, the background calibration can use the phase error and the timestamp information to update PWL parameters. For example, in FIG. 13, the DCO step is larger than a PWL calibrated threshold for a given code. During the modulation the phase error will be negative when that code is used, as shown in FIG. 14. The coherent feature extractor block (background calibration) will increase the threshold value entry for a given code in order to minimize the phase error. Multiple features (slope/step/transient errors) can be extracted in one measurement. The finite switching time of the coarse bank capacitor creates the transient frequency error as shown in FIGS. 13 and 14. The transient frequency error can be compensated by adding the compensation input, freq_error_comp, to the fine path quantization input after the coarse bank code transition is detected. When ramp_offset is used, the compensation can have any polarity.

In this specification, embodiments have been presented in terms of a selected set of details. However, a person of ordinary skill in the art would understand that many other embodiments may be practiced which include a different selected set of these details. It is intended that the following claims cover all possible embodiments.

REFERENCE NUMERALS 100 phase-locked loop circuit
110 oscillator
111 modulation input signal
112 output signal
120 control unit
121 calibration unit
122 control input signal
123 frequency generator
128 coarse capacitor control code
129 fine capacitor control code
130 divider
131 divider control unit
132 divider control signal
133 divider input signal
134 divider output signal
140 phase detector
141 reference signal with reference frequency
224 coarse bank INL look-up table
225 scaling factor look-up table
226 fine bank INL look-up table
413 bank of capacitors
414 capacitor
415 switched-out capacitor
516 switched-in capacitor
617 DNL (PWL calibration)
618 DNL (OCD calibration)
819 bank of fine capacitors
1050 output frequency
1051 first frequency
1052 second frequency
1053 further first frequency
1054 further second frequency
1055 total fine frequency difference
1056 further total fine frequency difference
1057 fixed state of the coarse bank
1058 further fixed state of the coarse bank

The invention claimed is:

1. A method of controlling a frequency-modulated oscillator of a phase-locked loop circuit, wherein the oscillator comprises a bank of capacitors, the method comprising the steps of
switching a capacitor of the bank of capacitors to change an output signal of the oscillator from a first output signal having a first frequency to a second output signal having a second frequency;
feeding the first output signal having the first frequency to a divider of the phase-locked loop circuit, and controlling the divider by means of a first divider control signal so that a divider output signal corresponds to a reference signal having a reference frequency;
feeding the second output signal having the second frequency to the divider, and controlling the divider by means of a second divider control signal so that the divider output signal corresponds to the reference signal having the reference frequency;
determining a frequency information associated with the capacitor and based on at least one of the first frequency and the second frequency and based on at least one of the first divider control signal and the second divider control signal; and
writing the frequency information to a look-up table stored in a control unit of the oscillator.

2. The method according to claim 1, wherein the oscillator comprises a variable LC circuit.

3. The method according to claim 1, wherein the capacitor is switched in and out repeatedly and wherein the frequency information is determined based on an average of differences between respective first and second frequencies.

4. The method according to claim 1, wherein the capacitor is switched in response to a control code received from a calibration unit.

5. The method according to claim 1, further comprising
receiving, by the control unit, a control input signal associated with a desired frequency of the output signal to be output by the oscillator;
reading the frequency information from the look-up table; and
switching in or switching out the capacitor depending on the frequency information.

6. The method according to claim 5, further comprising
determining a phase error by means of a phase detector of the phase-locked loop circuit; and
updating the frequency information based on the phase error.

7. The method according to claim 1, wherein a circuit path between a phase detector of the phase-locked loop circuit and the oscillator is interrupted when determining the frequency information, the method further comprising
after determining the frequency information, reconnecting the circuit path between the phase detector and the oscillator, in particular to determine and/or at least partially compensate a temperature drift of the oscillator.

8. The method according to claim 1, further comprising
subsequently switching at least one further capacitor of the bank of capacitors so that, for every further capacitor being switched, the output frequency changes from a respective further first frequency to a respective further second frequency;
for every further capacitor being switched, determining a respective further frequency information associated with the respective further capacitor and based on at least one of the respective further first frequency and the respective further second frequency; and
for every further capacitor being switched, writing the respective further frequency information to the look-up table stored in the control unit.

9. The method according to claim 8, wherein the capacitor and the at least one further capacitor, are switched, in particular switched in or switched out, in a predetermined order.

10. The method according to claim 1, wherein the capacitors of the bank of capacitors are coarse capacitors and wherein the oscillator further comprises a bank of fine capacitors having capacitances smaller than the capacitances of the coarse capacitors, wherein the method further comprises the steps of:
for a fixed state of the coarse bank, subsequently switching at least one fine capacitor of the bank of fine capacitors so that, for every fine capacitor being switched, the output frequency changes from a respective first fine frequency to a respective second fine frequency;

for every fine capacitor being switched, determining a respective fine frequency information associated with the respective fine capacitor and based on at least one of the respective first fine frequency and the respective second fine frequency; and for every fine capacitor being switched, writing the respective fine frequency information to the look-up table.

11. A method of controlling a frequency-modulated oscillator of a phase-locked loop circuit, the method comprising the steps of:

switching a coarse capacitor of a coarse bank of capacitors of the oscillator to change an output frequency of an output signal of the oscillator from a first frequency to a second frequency;

determining a coarse frequency information associated with the coarse capacitor and based on at least one of the first frequency and the second frequency;

writing the coarse frequency information to a look-up table stored in a control unit of the oscillator;

for a fixed state of the coarse bank of capacitors, subsequently switching at least one fine capacitor of a fine bank of capacitors of the oscillator so that, for every fine capacitor being switched, the output frequency changes from a respective first fine frequency to a respective second fine frequency, wherein fine capacitors of the fine bank of capacitors have capacitances smaller than the capacitances of the coarse capacitors;

for every fine capacitor being switched, determining a respective fine frequency information associated with the respective fine capacitor and based on at least one of the respective first fine frequency and the respective second fine frequency;

for every fine capacitor being switched, writing the respective fine frequency information to the look-up table;

determining a total fine frequency difference between a state, when all fine capacitors are switched in for the fixed state of the coarse bank, and a state, when all fine capacitors are switched out for the fixed state of the coarse bank;

for a further fixed state of the coarse bank different from the fixed state of the coarse bank, determining a further total fine frequency difference between a state, when all fine capacitors are switched in for the further fixed state of the coarse bank, and a state, when all fine capacitors are switched out for the further state of the coarse bank;

determining a scaling factor for the further fixed state of the coarse bank based on the ratio between the total fine frequency difference and the further total fine frequency difference; and writing the scaling factor to the look-up table.

12. The method of claim 11, further comprising receiving, by the control unit, a desired frequency of the output signal to be output by the oscillator;

consulting the look-up table to determine the state of the coarse bank and the coarse capacitors to be switched;

determining a desired residual frequency based on the desired frequency and a frequency corresponding to the state of the coarse bank;

consulting the look-up table to determine, based on the residual frequency and on a scaling factor defined by the state of the coarse bank, the state of the fine bank and the fine capacitors to be switched in order to realize the desired residual frequency; and switching the determined coarse capacitors and the determined fine capacitors.

13. A frequency-modulated oscillator for a phase-locked loop circuit, comprising a bank of capacitors; and a control unit configured to switch a capacitor of the bank of capacitors to change an output signal of the oscillator from a first output signal having a first frequency to a second output signal having a second frequency;

feed the first output signal having the first frequency to a divider of the phase-locked loop circuit, and control the divider by means of a first divider control signal so that a divider output signal corresponds to a reference signal having a reference frequency;

feed the second output signal having the second frequency to the divider, and control the divider by means of a second divider control signal so that the divider output signal corresponds to the reference signal having the reference frequency;

determine a frequency information associated with the capacitor and based on at least one of the first frequency and the second frequency and based on at least one of the first divider control signal and the second divider control signal; and write the frequency information to a look-up table stored in the control unit.

14. The frequency-modulated oscillator according to claim 13, wherein the control unit is further configured to:

receive a control input signal associated with a desired frequency of the output signal to be output by the oscillator;

read the frequency information from the look-up table; and switch in or switch out the capacitor depending on the frequency information.

15. The frequency-modulated oscillator according to claim 13, wherein the capacitors of the bank of capacitors are coarse capacitors, the frequency-modulated oscillator further comprising:

a bank of fine capacitors having capacitances smaller than the capacitances of the coarse capacitors, wherein the control unit is further configured to:

subsequently switch, for a fixed state of the coarse bank, at least one fine capacitor of the bank of fine capacitors so that, for every fine capacitor being switched, the output frequency changes from a respective first fine frequency to a respective second fine frequency;

determine, for every fine capacitor being switched, a respective fine frequency information associated with the respective fine capacitor and based on at least one of the respective first fine frequency and the respective second fine frequency; and write, for every fine capacitor being switched, the respective fine frequency information to the look-up table.

16. The frequency-modulated oscillator according to claim 13, wherein the control unit is further configured to:

receive a control input associated with a desired frequency of the output signal to be output by the oscillator;

read the frequency information from the look-up table; and switch in or switch out the capacitor depending on the frequency information.

17. The frequency-modulated oscillator according to claim 16, wherein the desired frequency derives from a desired frequency sequence, which varies linearly in time.

18. The frequency-modulated oscillator according to claim 16, wherein the control unit is further configured to:
- determine a phase error by means of a phase detector of the phase-locked loop circuit; and
- update the frequency information based on the phase error.

* * * * *